(12) United States Patent
Ikeuchi et al.

(10) Patent No.: US 9,219,014 B2
(45) Date of Patent: Dec. 22, 2015

(54) MANUFACTURING METHOD OF LIGHT EMITTING ELEMENTS, AND MANUFACTURING APPARATUS OF LIGHT EMITTING ELEMENTS

(75) Inventors: Hiroki Ikeuchi, Osaka (JP); Tomonori Itoh, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/117,656

(22) PCT Filed: Mar. 21, 2012

(86) PCT No.: PCT/JP2012/001929
§ 371 (c)(1),
(2), (4) Date: Nov. 14, 2013

(87) PCT Pub. No.: WO2012/160739
PCT Pub. Date: Nov. 29, 2012

(65) Prior Publication Data
US 2014/0080231 A1  Mar. 20, 2014

(30) Foreign Application Priority Data
May 24, 2011 (JP) .................. 2011-115729

(51) Int. Cl.
*H01L 21/66* (2006.01)
*H01L 33/10* (2010.01)
*H01L 33/50* (2010.01)

(52) U.S. Cl.
CPC ............... *H01L 22/12* (2013.01); *H01L 33/10* (2013.01); *H01L 33/502* (2013.01);
(Continued)

(58) Field of Classification Search
CPC ............... H01L 2933/0041; H01L 2933/0033; H01L 2933/005; H01L 2933/0058; G01N 21/64; G01N 21/643
USPC ............ 250/459.1, 458.1; 356/630; 257/209, 257/E23.148
See application file for complete search history.

(56) References Cited

U.S. PATENT DOCUMENTS 4,651,011 A * 3/1987 Ors et al. .................. 250/459.1
6,224,733 B1 * 5/2001 Takahashi et al. ............ 204/603
(Continued)

FOREIGN PATENT DOCUMENTS

JP  10-065221 A   3/1998
JP    2998696 B2  11/1999
(Continued)

OTHER PUBLICATIONS

International Search Report for Application No. PCT/JP2012/001929, dated Jun. 26, 2012.
(Continued)

*Primary Examiner* — Duy T Nguyen
*Assistant Examiner* — Bo Bin Jang
(74) *Attorney, Agent, or Firm* — RatnerPrestia

(57) ABSTRACT

A manufacturing method of white-light emitting elements that is one example of the present invention is a manufacturing method of a white-light emitting element with the light emitting diode chip covered with the fluorescent-body-containing resin member that has been formed with the fluorescent-body-containing resin material containing a resin and fluorescent bodies, and includes: an irradiating step of irradiating the fluorescent-body-containing resin material with the blue laser beam; a measuring step of measuring the fluorescence strength of the fluorescence light emission from the fluorescent bodies that have been excited by the blue laser beam with which the irradiation has been carried out; and an applying step of applying, to the light emitting diode chip, a quantity of the fluorescent-body-containing resin material, the quantity being based on the fluorescence strength that has been measured.

4 Claims, 11 Drawing Sheets

(52) U.S. Cl.
CPC .... *H01L 33/505* (2013.01); *H01L 2224/45144* (2013.01); *H01L 2224/48091* (2013.01); *H01L 2224/48247* (2013.01); *H01L 2224/48465* (2013.01); *H01L 2224/49107* (2013.01); *H01L 2224/73265* (2013.01); *H01L 2933/0041* (2013.01)

(56) References Cited

U.S. PATENT DOCUMENTS

2003/0095582 A1* 5/2003 Ackley ............................ 372/108
2008/0137106 A1* 6/2008 Ono ................................ 356/630

FOREIGN PATENT DOCUMENTS

| | | |
|---|---|---|
| JP | 2000-223750 A | 8/2000 |
| JP | 3367096 B2 | 11/2002 |
| JP | 2003-260403 A | 9/2003 |
| JP | 2004-186488 A | 7/2004 |
| JP | 2004-363635 A | 12/2004 |
| JP | 3724498 B2 | 9/2005 |
| JP | 2007-179880 A | 7/2007 |
| JP | 2007-311663 A | 11/2007 |
| JP | 2008-145300 A | 6/2008 |
| JP | 2009-051107 A | 3/2009 |
| JP | 2009-231569 A | 10/2009 |
| JP | 2010-080588 A | 4/2010 |
| WO | WO 2010/004995 A1 | 1/2010 |

OTHER PUBLICATIONS

KR Office Action for 10-2013-7028497, Nov. 21, 2014.

* cited by examiner

MANUFACTURING METHOD OF LIGHT EMITTING ELEMENTS, AND MANUFACTURING APPARATUS OF LIGHT EMITTING ELEMENTS

CROSS-REFERENCE TO RELATED APPLICATIONS

This application is a U.S. national phase application of PCT International Patent Application No. PCT/JP2012/001929 filed Mar. 21, 2012, claiming the benefit of priority of Japanese Patent Application No. 2011-115729 filed May 24, 2011, all of which are incorporated by reference herein in their entirety.

TECHNICAL FIELD

The present invention relates to a manufacturing method of light emitting elements, and a manufacturing apparatus of light emitting elements, for manufacturing light emitting elements that are applied to, for example, illuminating devices of on-vehicle uses and the like, projectors, and liquid crystal back lights.

BACKGROUND ART

A white-light emitting element using a semiconductor is expected as a substitute of the next generation for a bulb like an electric bulb, a fluorescent tube and a cold-cathode tube, which is utilized for the so-called general illumination and the like.

A white-light emitting element like this is an element such that a light emitting diode chip, which has been bonded to a base plate, has been covered by a fluorescent-body-containing resin member and the like that has been formed with a fluorescent-body-containing resin material that contains: a resin such as a translucent resin and the like; and fluorescent bodies that are configured by fluorescent-body particles.

In the forming step of the fluorescent-body-containing resin member, the fluorescent-body-containing resin material for forming the fluorescent-body-containing resin member is applied in an unhardened liquid state to the light emitting diode chip, and the fluorescent-body-containing resin material is in the subsequent step allowed to harden.

Here, as methods that are utilized for forming fluorescent-body-containing resin members, there are a method that uses a cup (for example, see Japanese Patent Publication No. 2998696), a method that uses stencil printing (for example, see Japanese Patent Publication No. 3367096), a method that uses a transfer mold (for example, see Japanese Patent Publication No. 3724498), a method that uses a compression mold (for example, see Japanese Patent Application Publication No. 2009-051107), and the like.

Now, the white light of the white-light emitting element is obtained by the light from the light emitting diode chip, and the light from the fluorescent bodies that have been excited by the light from the light emitting diode chip.

For example, the blue light from the light emitting diode chip, and the yellow light from the fluorescent bodies are blended together, and the white light that has a prescribed chromaticity is obtained.

Hence, the chromaticity variation of individual white-light emitting elements becomes a cause of a lowering of the yield.

Several methods for suppressing chromaticity variation like this are known.

Accordingly, mainly referring to FIG. 11, specific descriptions are given regarding conventional manufacturing methods of white-light emitting elements like those (for example, see Japanese Patent Application Publication No. 2009-231569 and Japanese Patent Application Publication No. 2004-186488).

Additionally, FIG. 11(A) is a schematic perpendicular-section view of the first conventional white-light emitting element, and FIG. 11(B) is a schematic perpendicular-section view of the second conventional white-light emitting element.

Here, the perpendicular-section views are section views such that cutting is carried out with a perpendicular face perpendicular to the horizontal face parallel to the base plate face of the base plate (the same shall apply hereinafter).

As is shown in FIG. 11(A), in the first conventional white-light emitting element, the second fluorescent-body-containing resin member 802 is formed on the upper face of the first fluorescent-body-containing resin member 801 that covers the light emitting diode chip. The chromaticity variation of individual white-light emitting elements is suppressed by adjusting the concentration of the fluorescent bodies the fluorescent-body-containing resin material for forming the second fluorescent-body-containing resin member 802 contains, and the quantity of the fluorescent-body-containing resin material for forming the second fluorescent-body-containing resin member 802.

As is shown in FIG. 11(B), in the second conventional white-light emitting element, the translucent resin member 804 that has been formed with a translucent resin material, which contains a translucent resin but does not contain fluorescent bodies, is formed on the surface of the fluorescent-body-containing resin member 803. The chromaticity variation of individual white-light emitting elements is suppressed by adjusting the absorption quantity of light in the translucent resin member 804 by control of the quantity of the translucent resin material for forming the translucent resin member 804.

SUMMARY OF THE INVENTION

Problems to be Solved by the Invention

However, it has become clear that, also in the above-stated conventional manufacturing methods of white-light emitting elements, there are inconveniences for performing, as suppressing the chromaticity variation of individual white-light emitting elements, manufacture of white-light emitting elements of higher quality.

Making a more specific statement, an analysis by the present inventors is showing that, regarding the first conventional white-light emitting element, since the quantity of the fluorescent-body-containing resin material for forming the second fluorescent-body-containing resin member 802 varies, as a result the chromaticity variation of individual white-light emitting elements is sometimes not sufficiently suppressed.

And, an analysis by the present inventors is showing that, regarding the second conventional white-light emitting element, since in case the quantity of the translucent resin material for forming the translucent resin member 804 is allowed to be large in order to adjust the chromaticity of the white-light emitting element, the thickness of the translucent resin member 804 becomes large and the absorption quantity of light from the light emitting diode chip in the translucent resin member 804 increases, as a result the light-extraction efficiency is sometimes lowered.

In short, it has been difficult to reduce the chromaticity variation of individual light emitting elements while avoiding a lowering of the light-extraction efficiency.

The present invention furnishes, in consideration of the above-stated conventional problems, a manufacturing method of light emitting elements, and a manufacturing apparatus of light emitting elements such that it is possible to reduce the chromaticity variation of individual light emitting elements while avoiding a lowering of the light-extraction efficiency.

Means for Solving the Problem

The 1$^{st}$ aspect of the present invention is a manufacturing method of a light emitting element with a light emitting diode covered with a fluorescent-body-containing resin member that has been formed with a fluorescent-body-containing resin material containing a resin and fluorescent bodies, comprising:

an irradiating step of irradiating the fluorescent-body-containing resin material with a light;

a measuring step of measuring a fluorescence strength of a fluorescence light emission from the fluorescent bodies that have been excited by the light with which irradiation has been carried out; and an applying step of applying, to the light emitting diode, a quantity of the fluorescent-body-containing resin material, the quantity being based on the fluorescence strength that has been measured.

The 2$^{nd}$ aspect of the present invention is a manufacturing method of a light emitting element according to the 1$^{st}$ aspect of the present invention, wherein:

the irradiating step, as increasing a size of a droplet while maintaining the fluorescent-body-containing resin material in a state of being the droplet, irradiates the fluorescent-body-containing resin material in the state of being the droplet with the light; and the applying step performs a comparison between the fluorescence strength that has been measured and the fluorescence strength that is a target, stops, based on a result of the comparison, increasing of the size of the droplet at a point in time when the fluorescence strength that has been measured has reached the fluorescence strength that is the target, and applies the quantity of the fluorescent-body-containing resin material at the point in time.

The 3$^{rd}$ aspect of the present invention is a manufacturing method of a light emitting element according to the 1$^{st}$ aspect of the present invention, wherein:

the irradiating step introduces the fluorescent-body-containing resin material in a liquid reservoir, and irradiates the fluorescent-body-containing resin material that has been introduced in the liquid reservoir with the light; and the applying step performs, based on the fluorescence strength that has been measured, a calculation relating to the quantity of the fluorescent-body-containing resin material to be applied, and applies the quantity of the fluorescent-body-containing resin material corresponding to a result of the calculation.

The 4$^{th}$ aspect of the present invention is a manufacturing apparatus of a light emitting element with a light emitting diode covered with a fluorescent-body-containing resin member that has been formed with a fluorescent-body-containing resin material containing a resin and fluorescent bodies, comprising:

an applying part that has a needle, is capable of increasing a size of a droplet while maintaining at a tip of the needle the fluorescent-body-containing resin material in a state of being the droplet, and applies to the light emitting diode the fluorescent-body-containing resin material;

a light source part that irradiates with a light the fluorescent-body-containing resin material that is being maintained at the tip of the needle in the state of being the droplet;

a measuring part that measures a fluorescence strength of a fluorescence light emission from the fluorescent bodies that have been excited by the light with which irradiation has been carried out;

a comparing part that performs a comparison between the fluorescence strength that has been measured and the fluorescence strength that is a target; and a controlling part that stops, based on a result of the comparison, increasing of the size of the droplet at a point in time when the fluorescence strength that has been measured has reached the fluorescence strength that is the target, and controls the applying part so that the fluorescent-body-containing resin material at the point in time, which is being maintained at the tip of the needle in the state of being the droplet, is applied.

The 5$^{th}$ aspect of the present invention is a manufacturing apparatus of a light emitting element with a light emitting diode covered with a fluorescent-body-containing resin member that has been formed with a fluorescent-body-containing resin material containing a resin and fluorescent bodies, comprising:

an applying part that has a liquid reservoir, is capable of introducing the fluorescent-body-containing resin material in the liquid reservoir, and applies to the light emitting diode the fluorescent-body-containing resin material;

a light source part that irradiates with a light the fluorescent-body-containing resin material that has been introduced in the liquid reservoir;

a measuring part that measures a fluorescence strength of a fluorescence light emission from the fluorescent bodies that have been excited by the light with which irradiation has been carried out;

a calculating part that performs, based on the fluorescence strength that has been measured, a calculation relating to a quantity of the fluorescent-body-containing resin material to be applied; and a controlling part that controls the applying part so that the quantity of the fluorescent-body-containing resin material corresponding to a result of the calculation is applied.

The 6$^{th}$ aspect of the present invention is a manufacturing apparatus of a light emitting element according to the 4$^{th}$ or 5$^{th}$ aspect of the present invention, wherein the measuring part is arranged at a position where the fluorescence light emission enters from a direction orthogonal to a direction in which the light source part carries out the irradiation with the light.

Effects of the Invention

By the present invention, can be furnished a manufacturing method of light emitting elements, and a manufacturing apparatus of light emitting elements such that it is possible to reduce the chromaticity variation of individual light emitting elements while avoiding a lowering of the light-extraction efficiency.

MODES FOR IMPLEMENTING THE INVENTION

Figure 1:
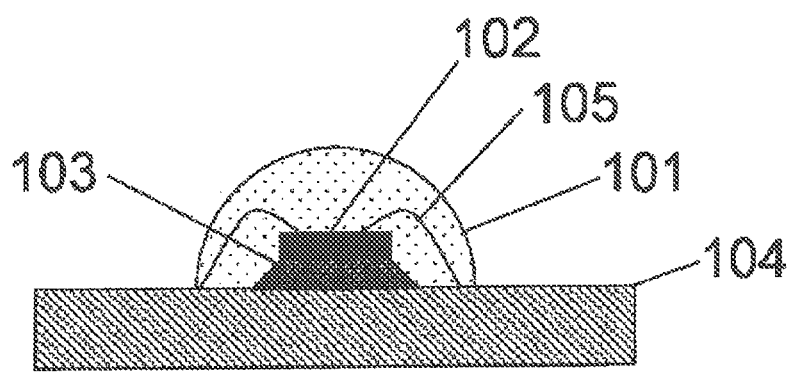
FIG. 1 is a schematic perpendicular-section view of the white-light emitting element of Embodiment 1 in the present invention.

In the following, referring to the drawings, detailed descriptions are given regarding embodiments in the present invention.

Embodiment 1

Figure 2:
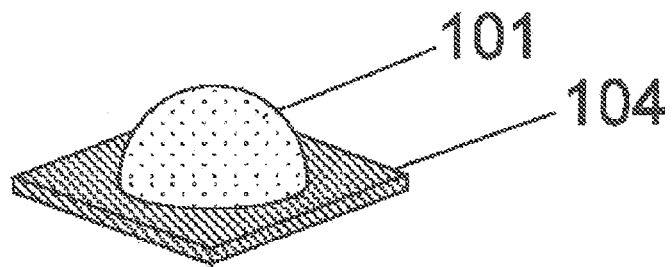
FIG. 2 is a schematic perspective view of the white-light emitting element of Embodiment 1 in the present invention.

In the beginning, mainly referring to FIGS. 1 and 2, descriptions are given regarding the configuration of the white-light emitting element of the present embodiment.

Additionally, FIG. 1 is a schematic perpendicular-section view of the white-light emitting element of Embodiment 1 in the present invention.

Moreover, FIG. 2 is a schematic perspective view of the white-light emitting element of Embodiment 1 in the present invention.

The white-light emitting element of the present embodiment comprises the fluorescent-body-containing resin member 101, the light emitting diode chip 102, the die bond member 103, the base plate 104, and the gold (Au) wires 105.

The light emitting diode chip 102 is a blue-light emitting element such that the peak wavelength of its light emission is about 450 nm.

The fluorescent-body-containing resin member 101 is a member that has been formed with the fluorescent-body-containing resin material 202 (see FIG. 3(B)) as a mixture, which contains: a resin such as a translucent resin and the like that is often called a transparent resin; and fluorescent bodies that are configured by fluorescent-body particles.

The resin is at least one of a silicon resin and an epoxy resin.

The fluorescent bodies are fluorescent bodies that are excited at the wavelength of the light emission of the light emitting diode chip 102.

Additionally, the fluorescent-body-containing resin material 202 may contain resins and fluorescent bodies that are different from these, and may further contain others.

The fluorescent-body-containing resin member 101 is completely covering the light emitting diode chip 102.

The light emitting diode chip 102 is bonded to the base plate 104 by the die bond member 103, and is electrically connected to the electrodes (not shown) by the gold wires 105.

The die bond member 103 is formed with at least one of a resin and a metal.

The base plate 104 is a base plate such that the above-stated electrodes have been formed on the base plate face, namely, the surface of the substrate on which the light emitting diode chip 102 has been mounted.

The electrodes are formed with, for example, at least one of gold, silver (Ag), copper (Cu), aluminum (Al) and tin (Sn), or an alloy that includes at least one of these.

The substrate is formed with, for example, at least one of aluminum oxide (Al$_2$O$_3$), aluminum nitride (AlN), silicon carbide (SiC), copper, aluminum and glass epoxy.

Additionally, the base plate 104 may be, not a tabular base plate, a base plate that has been configured by a lead frame of copper and the like.

Figure 3:
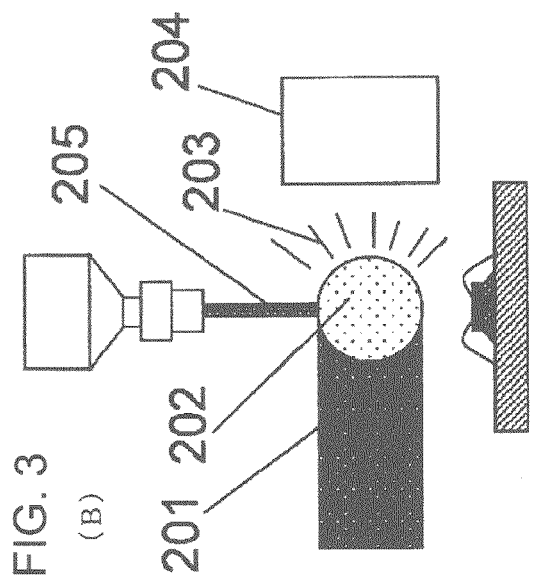
FIG. 3(A) is a schematic front view for describing the arrangement of the dispensing needle, in the manufacturing method of white-light emitting elements of Embodiment 1 in the present invention.
FIG. 3(B) is a schematic front view for describing the discharge of the fluorescent-body-containing resin material, and the irradiation with the blue laser beam, in the manufacturing method of white-light emitting elements of Embodiment 1 in the present invention.
FIG. 3(C) is a schematic front view for describing the descending of the dispensing needle, and the application of the fluorescent-body-containing resin material, in the manufacturing method of white-light emitting elements of Embodiment 1 in the present invention.
FIG. 3(D) is a schematic front view for describing the ascending of the dispensing needle, and the shunting of the measuring part, in the manufacturing method of white-light emitting elements of Embodiment 1 in the present invention.
Figure 3:
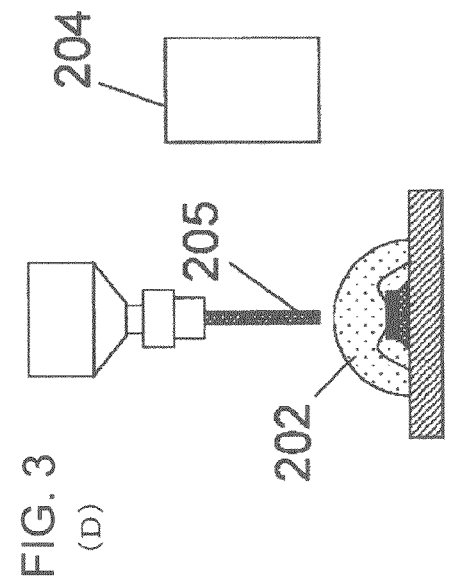
Figure 3:
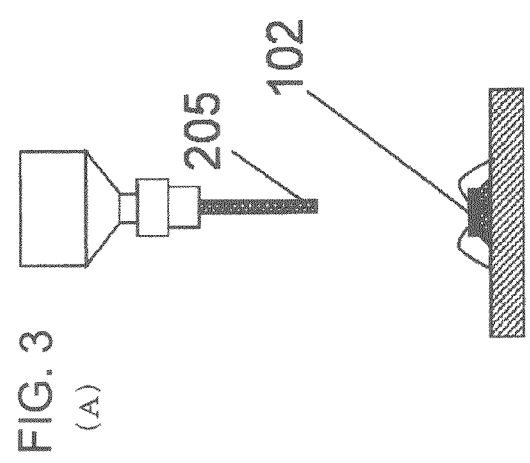
Figure 3:
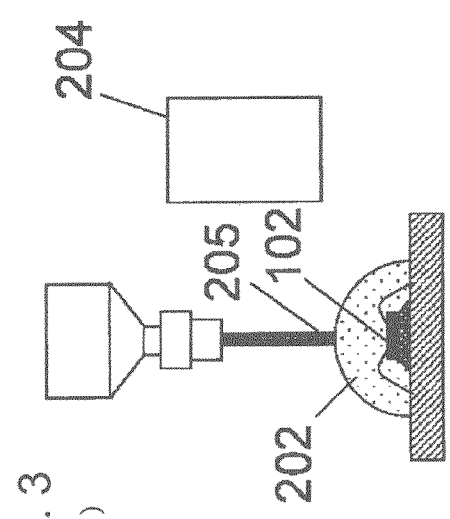
Figures 4A, 4B, 4C:
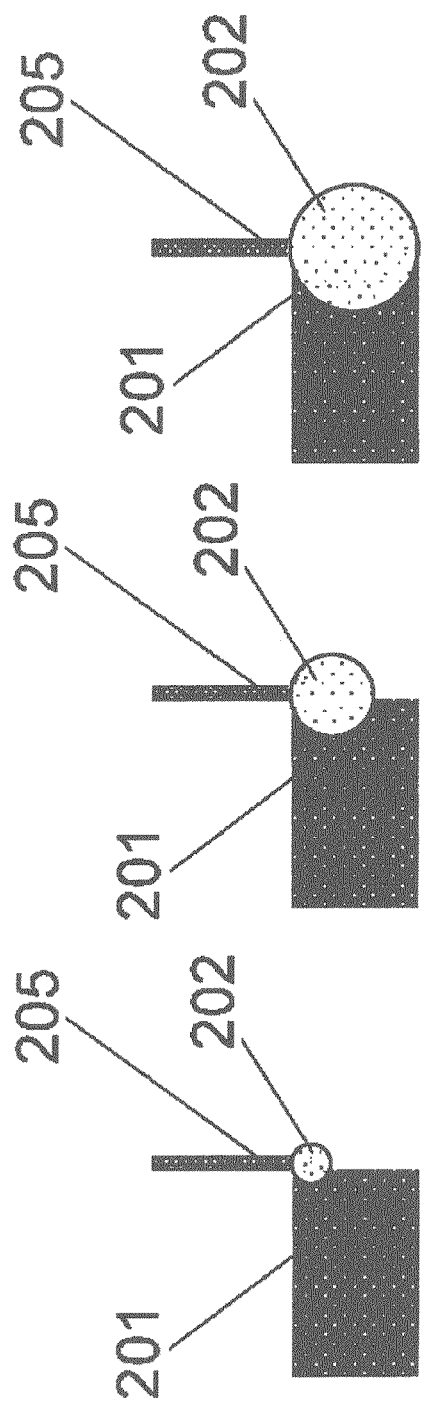
FIG. 4(A) is a schematic partial enlarged front view for describing the state at a point in time right after the start of the discharge of the fluorescent-body-containing resin material, in the manufacturing method of white-light emitting elements of Embodiment 1 in the present invention.
FIG. 4(B) is a schematic partial enlarged front view for describing the state at a point in time during the discharge of the fluorescent-body-containing resin material, in the manufacturing method of white-light emitting elements of Embodiment 1 in the present invention.
FIG. 4(C) is a schematic partial enlarged front view for describing the state at the point in time of the suspension of the discharge of the fluorescent-body-containing resin material, in the manufacturing method of white-light emitting elements of Embodiment 1 in the present invention.
Figure 5:
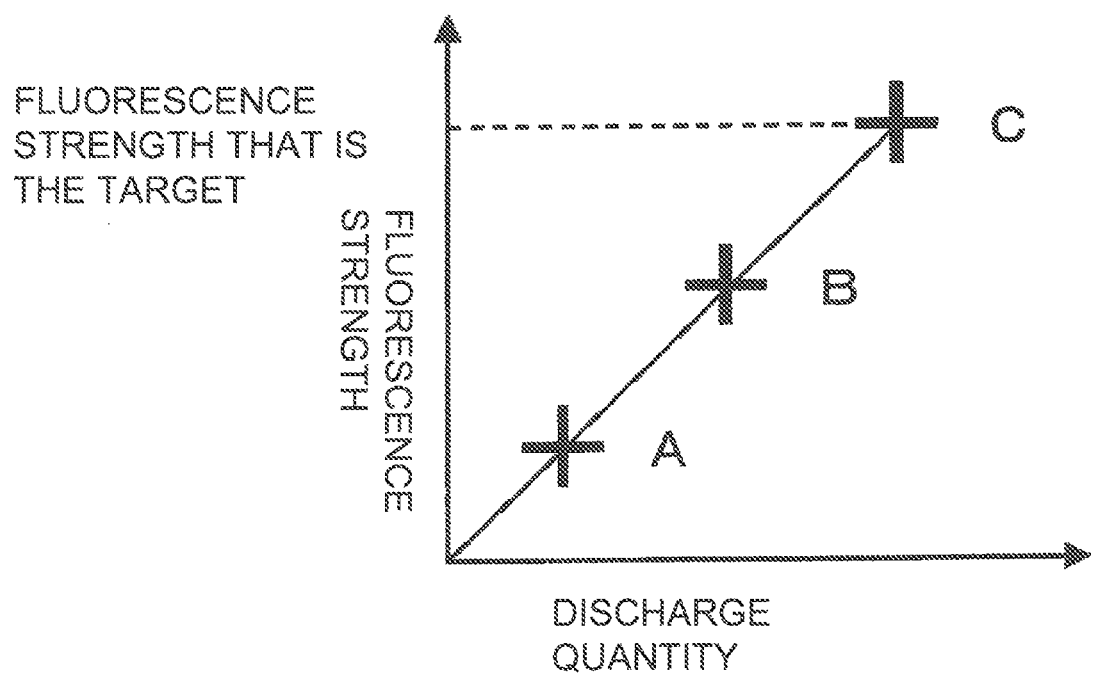
FIG. 5 is a descriptive view of the mutual relation between the discharge quantity of the fluorescent-body-containing resin material, and the fluorescence strength of the fluorescence light emission that is measured by the measuring part, in the manufacturing method of white-light emitting elements of Embodiment 1 in the present invention.

Next, mainly referring to FIGS. 3-5, descriptions are given regarding the manufacturing method of white-light emitting elements of the present embodiment.

Additionally, FIG. 3(A) is a schematic front view for describing the arrangement of the dispensing needle 205, in the manufacturing method of white-light emitting elements of Embodiment 1 in the present invention, FIG. 3(B) is a schematic front view for describing the discharge of the fluorescent-body-containing resin material 202, and the irradiation with the blue laser beam 201, in the manufacturing method of white-light emitting elements of Embodiment 1 in the present invention, FIG. 3(C) is a schematic front view for describing the descending of the dispensing needle 205, and the application of the fluorescent-body-containing resin material 202, in the manufacturing method of white-light emitting elements of Embodiment 1 in the present invention, and FIG. 3(D) is a schematic front view for describing the ascending of the dispensing needle 205, and the shunting of the measuring part 204, in the manufacturing method of white-light emitting elements of Embodiment 1 in the present invention.

Moreover, FIG. 4(A) is a schematic partial enlarged front view for describing the state at a point in time right after the start of the discharge of the fluorescent-body-containing resin material 202, in the manufacturing method of white-light emitting elements of Embodiment 1 in the present invention, FIG. 4(B) is a schematic partial enlarged front view for describing the state at a point in time during the discharge of the fluorescent-body-containing resin material 202, in the manufacturing method of white-light emitting elements of Embodiment 1 in the present invention, and FIG. 4(C) is a schematic partial enlarged front view for describing the state at the point in time of the suspension of the discharge of the fluorescent-body-containing resin material 202, in the manufacturing method of white-light emitting elements of Embodiment 1 in the present invention.

Moreover, FIG. 5 is a descriptive view of the mutual relation between the discharge quantity of the fluorescent-body-containing resin material 202, and the fluorescence strength of the fluorescence light emission 203 that is measured by the measuring part 204, in the manufacturing method of white-light emitting elements of Embodiment 1 in the present invention.

The manufacturing method of white-light emitting elements of the present embodiment is a manufacturing method of a white-light emitting element with the light emitting diode chip 102 covered with the fluorescent-body-containing resin member 101 (see FIG. 1) that has been formed with the fluorescent-body-containing resin material 202 containing a resin and fluorescent bodies, and comprises: an irradiating step of irradiating the fluorescent-body-containing resin material 202 with the blue laser beam 201; a measuring step of measuring the fluorescence strength of the fluorescence light emission 203 from the fluorescent bodies that have been excited by the blue laser beam 201 with which the irradiation has been carried out; and an applying step of applying, to the light emitting diode chip 102, a quantity of the fluorescent-body-containing resin material 202, the quantity being based on the fluorescence strength that has been measured.

Additionally, in the irradiating step, as the size of the droplet is increased while the fluorescent-body-containing resin material 202 is maintained in a state of being a droplet, the fluorescent-body-containing resin material 202 is irradiated with the blue laser beam 201.

Moreover, in the applying step, performed is a comparison between the fluorescence strength that has been measured and the fluorescence strength that is the target and, stopping, based on the result of the comparison, increasing of the size of the droplet at a point in time when the fluorescence strength that has been measured has reached the fluorescence strength that is the target, the quantity of the fluorescent-body-containing resin material 202 at the point in time is applied.

In what follows, more detailed descriptions are given regarding the manufacturing method of white-light emitting elements of the present embodiment.

Particularly, more specific descriptions are given regarding the forming step of the fluorescent-body-containing resin member 101.

As is shown in FIG. 3(A), the dispensing needle 205 is arranged right above the light emitting diode chip 102.

As is shown in FIG. 3(B), the fluorescent-body-containing resin material 202 for forming the fluorescent-body-containing resin member 101 is discharged in an unhardened liquid state via the dispensing needle 205, and the irradiation with the blue laser beam 201 is carried out at the same time.

And, wavelength such as the peak wavelength and the like and fluorescence strength of the fluorescence light emission 203 from the fluorescent bodies, which have been excited by the blue laser beam 201, are measured by the measuring part 204 that has a spectroscope, which receives the light that has been radiated.

Additionally, since the viscosity of the fluorescent-body-containing resin material 202 for forming the fluorescent-body-containing resin member 101, which is discharged in a liquid state via the dispensing needle 205, is comparatively high, the fluorescent-body-containing resin material 202 can be maintained in a droplet state over a sufficiently long period of time.

It is more desirable that the peak wavelength of the blue laser beam 201, which could be equal to or less than 500 nm, be 450 nm that is equal to the peak wavelength of the light emission of the light emitting diode chip 102.

The fluorescence strength of the fluorescence light emission 203 may be measured as an actual measurement value of the radiation strength of one wavelength, such as the peak wavelength and the like of the wavelengths of the fluorescence light emission 203, and may be calculated as an integration value of the radiation strength of plural wavelengths of the wavelengths of the fluorescence light emission 203.

It is more desirable that the laser profile of the blue laser beam 201 have a spatially flat distribution.

Now, the irradiation with the blue laser beam 201, and the measurement of the wavelength and fluorescence strength of the fluorescence light emission 203 by the measuring part 204 are started at a point in time right after the start of the discharge of the fluorescent-body-containing resin material 202 (see FIG. 4(A)), and are continued at a point in time during the discharge of the fluorescent-body-containing resin material 202 (see FIG. 4(B)).

And, the discharge of the fluorescent-body-containing resin material 202 is suspended at a point in time when the fluorescence strength of the fluorescence light emission 203 has reached the fluorescence strength that is the target (see FIG. 4(C)).

As is shown in FIG. 5, the mutual relation between the discharge quantity of the fluorescent-body-containing resin material 202, and the fluorescence strength of the fluorescence light emission 203 that is measured by the measuring part 204 is approximately a proportional relation.

Here, the point A represents the discharge quantity and fluorescence strength at a point in time right after the start of the discharge of the fluorescent-body-containing resin material 202, the point B represents the discharge quantity and fluorescence strength at a point in time during the discharge of the fluorescent-body-containing resin material 202, and the point C represents the discharge quantity and fluorescence strength at the point in time of the suspension of the discharge of the fluorescent-body-containing resin material 202.

As is shown in FIG. 3(C), the dispensing needle 205 is allowed to descend, and the fluorescent-body-containing resin material 202 in a droplet state is applied to the light emitting diode chip 102 and is formed in a prescribed shape.

As is shown in FIG. 3(D), the dispensing needle 205 is allowed to ascend, and the measuring part 204 is allowed to shunt.

Additionally, the above-stated series of processes is implemented so as to terminate within a sufficiently short time to such an extent that no liquid sagging of the fluorescent-body-containing resin material 202 occurs.

And, a white-light emitting element is completed through the subsequent step of allowing the fluorescent-body-containing resin material 202 to harden at a constant temperature or more.

Additionally, the measuring part 204 may be, as shown in FIG. 3(B), arranged facing the light emitting source side of the blue laser beam 201 but, since an arrangement on the optical axis of the blue laser beam 201 is not desirable, an arrangement in a direction that is different from the irradiation direction of the blue laser beam 201 is more desirable. For example, in order to perform accurate measurement such that the blue laser beam 201 hardly enter directly thereinto, it is more desirable that the measuring part 204 be arranged, as is shown in FIG. 6, in a direction orthogonal to the irradiation direction 201D of the blue laser beam 201, viewed from the center of the fluorescent-body-containing resin material 202 in a droplet state.

Figure 6:
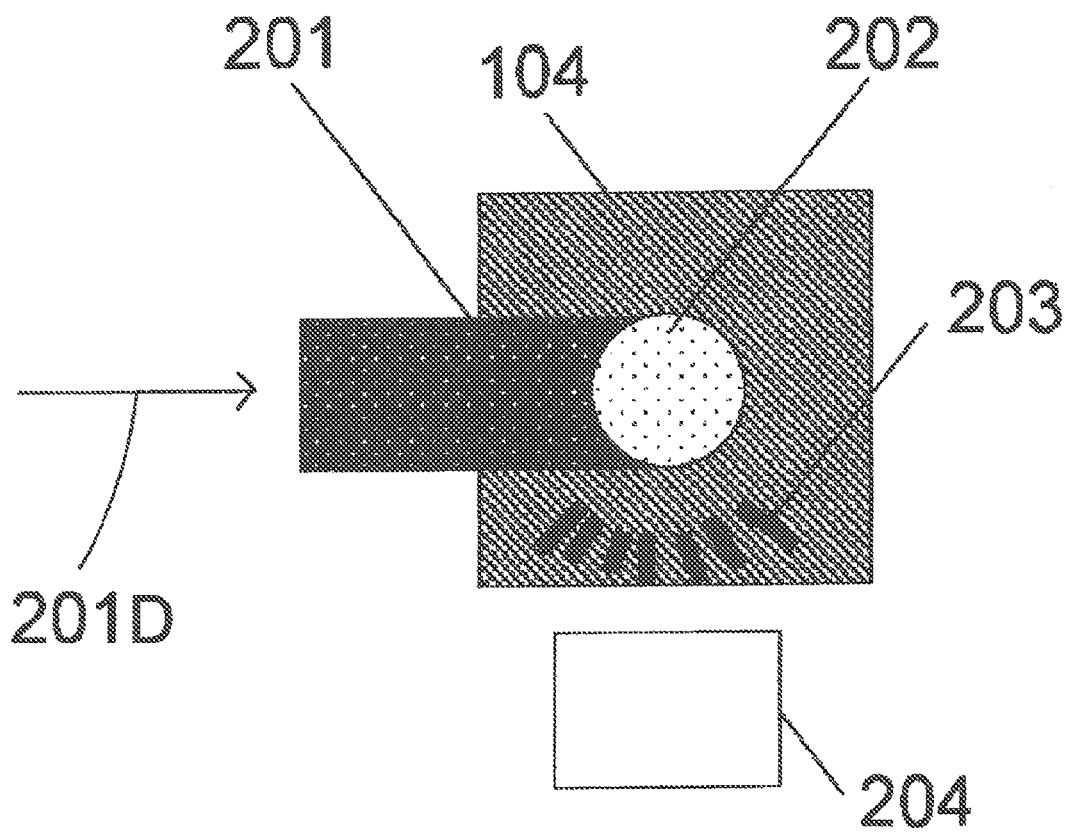
FIG. 6 is a schematic partial enlarged plan view for describing the irradiation with the blue laser beam that utilizes the measuring part which has been arranged in a direction orthogonal to the irradiation direction of the blue laser beam, viewed from the center of the fluorescent-body-containing resin material in a droplet state, in the manufacturing method of white-light emitting elements of an embodiment in the present invention.

Here, FIG. 6 is a schematic partial enlarged plan view for describing the irradiation with the blue laser beam 201 that utilizes the measuring part 204 which has been arranged in a direction orthogonal to the irradiation direction of the blue laser beam 201, in the manufacturing method of white-light emitting elements of an embodiment in the present invention.

Moreover, it is more desirable that the spot diameter of the blue laser beam 201 be large to such an extent that the irradiation of the whole of the fluorescent-body-containing resin material 202 in a droplet state can be carried out.

Figure 7:
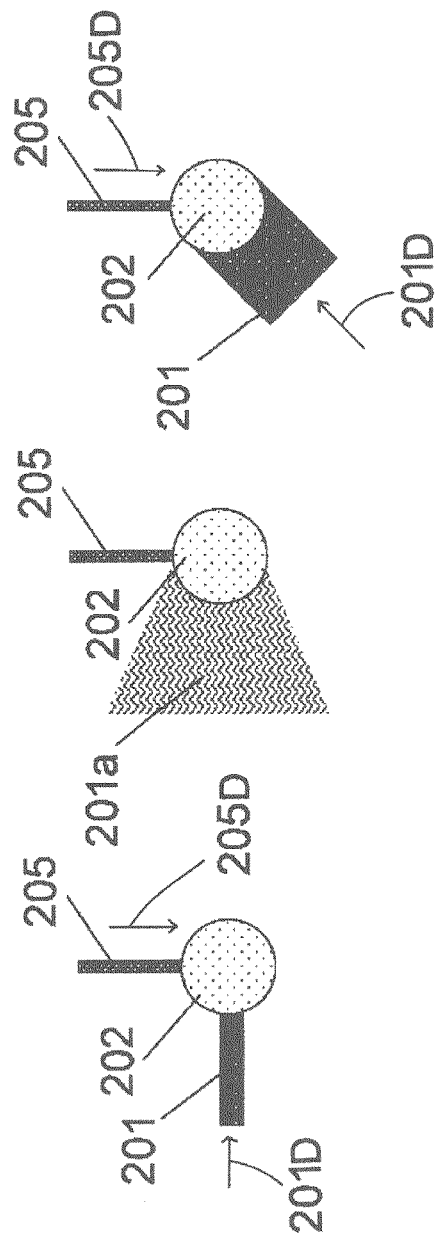
FIG. 7(A) is a schematic partial enlarged front view for describing the irradiation with the blue laser beam the spot diameter of which is small in comparison with the diameter of the fluorescent-body-containing resin material in a droplet state, in the manufacturing method of white-light emitting elements of an embodiment in the present invention.
FIG. 7(B) is a schematic partial enlarged front view for describing the irradiation with the light that has been collected, in the manufacturing method of white-light emitting elements of an embodiment in the present invention.
FIG. 7(C) is a schematic partial enlarged front view for describing the irradiation with the blue laser beam the irradiation direction of which is not included in the horizontal face that is orthogonal to the length direction of the dispensing needle and includes the tip of the dispensing needle, in the manufacturing method of white-light emitting elements of an embodiment in the present invention.

Additionally, the spot diameter of the blue laser beam 201 may be, as is shown in FIG. 7(A), small in comparison with the diameter of the fluorescent-body-containing resin material 202 in a droplet state in a case where, for example, the blue laser beam 201 is scattered in the fluorescent-body-containing resin material 202 with transparent particles and the like being included within the fluorescent-body-containing resin material 202.

Here, FIG. 7(A) is a schematic partial enlarged front view for describing the irradiation with the blue laser beam 201 the spot diameter of which is small in comparison with the diameter of the fluorescent-body-containing resin material 202 in a droplet state, in the manufacturing method of white-light emitting elements of an embodiment in the present invention.

Moreover, the light that has been generated by a light source such as an LED, an incandescent lamp, a discharge tube, and the like may be utilized instead of the blue laser beam 201. For example, the light 201a that has been, as is shown in FIG. 7(B), generated by a blue-light source such as an LED and the like and collected by a light collecting means such as a lens and the like may be utilized instead of the blue laser beam 201.

Here, FIG. 7(B) is a schematic partial enlarged front view for describing the irradiation with the light 201a that has been collected, in the manufacturing method of white-light emitting elements of an embodiment in the present invention.

Moreover, the irradiation direction 201D (see FIG. 7(A)) of the blue laser beam 201 may be substantially included in the horizontal face that is orthogonal to the length direction 205D of the dispensing needle 205 and includes the tip of the dispensing needle 205 but, for example, as is shown in FIG. 7(C), need not be included in the said horizontal face.

Here, FIG. 7(C) is a schematic partial enlarged front view for describing the irradiation with the blue laser beam 201 the irradiation direction of which is not included in a horizontal face, in the manufacturing method of white-light emitting elements of an embodiment in the present invention.

As has been stated in the foregoing, since the discharge of the fluorescent-body-containing resin material 202 is suspended at a point in time when the fluorescence strength of the fluorescence light emission 203 has reached the fluorescence strength that is the target, the fluorescence strength of individual white-light emitting elements that have been manufactured by the manufacturing method of white-light emitting elements of the present embodiment falls within a prescribed range.

Hence, for the manufacturing method of white-light emitting elements of the present embodiment, by reducing the fluorescence strength variation of individual white-light emitting elements in the forming step of the fluorescent-body-containing resin member, it is possible to radically reduce a lowering of the yield accompanying the chromaticity variation of individual white-light emitting elements to improve productivity.

Additionally, as a reason why the above-named fluorescence strength variation is generated, it is pointed out that, since there is a difference in specific gravity between the resin and the fluorescent bodies, sedimentation of the fluorescent bodies occurs, for instance, within the syringe, needle and cavity in the manufacturing apparatus.

Moreover, as another reason why the above-named fluorescence strength variation is generated, it is pointed out that bubbles exist within the syringe, needle and cavity. In case air is involved when the resin and the fluorescent bodies are stirred, or when the fluorescent-body-containing resin material flows within the syringe and needle, minute bubbles are mixed in the fluorescent-body-containing resin material. In case bubbles like those irregularly appear in the forming step of the fluorescent-body-containing resin member, the fluorescence strength variation is prone to be generated.

Moreover, as still another reason why the above-named fluorescence strength variation is generated, it is pointed out that the shapes of the fluorescent-body particles vary. The fluorescence strength is different depending on the shapes of the fluorescent-body particles. More specifically, such a qualitative tendency is observed that the fluorescence is strong in a case where the shapes of the fluorescent-body particles are spherical and that the fluorescence is weak in a case where the shapes of the fluorescent-body particles are other irregular shapes.

Moreover, as further still another reason why the above-named fluorescence strength variation is generated, it is pointed out that the fluorescent-body particles are flocculated. Such a tendency is observed that the fluorescence becomes weak in case the fluorescent-body particles are, along with the lapse of time, flocculated in the fluorescent-body-containing resin material, depending on the stirring condition.

Additionally, in the manufacturing method of white-light emitting elements of the present embodiment, since there is no need to form the translucent resin member 804 for adjusting the chromaticity as in the above-stated manufacturing method of the second conventional white-light emitting elements, for example, it is not feared that the light-extraction efficiency is lowered with the thickness of the element becoming large.

Figure 8:
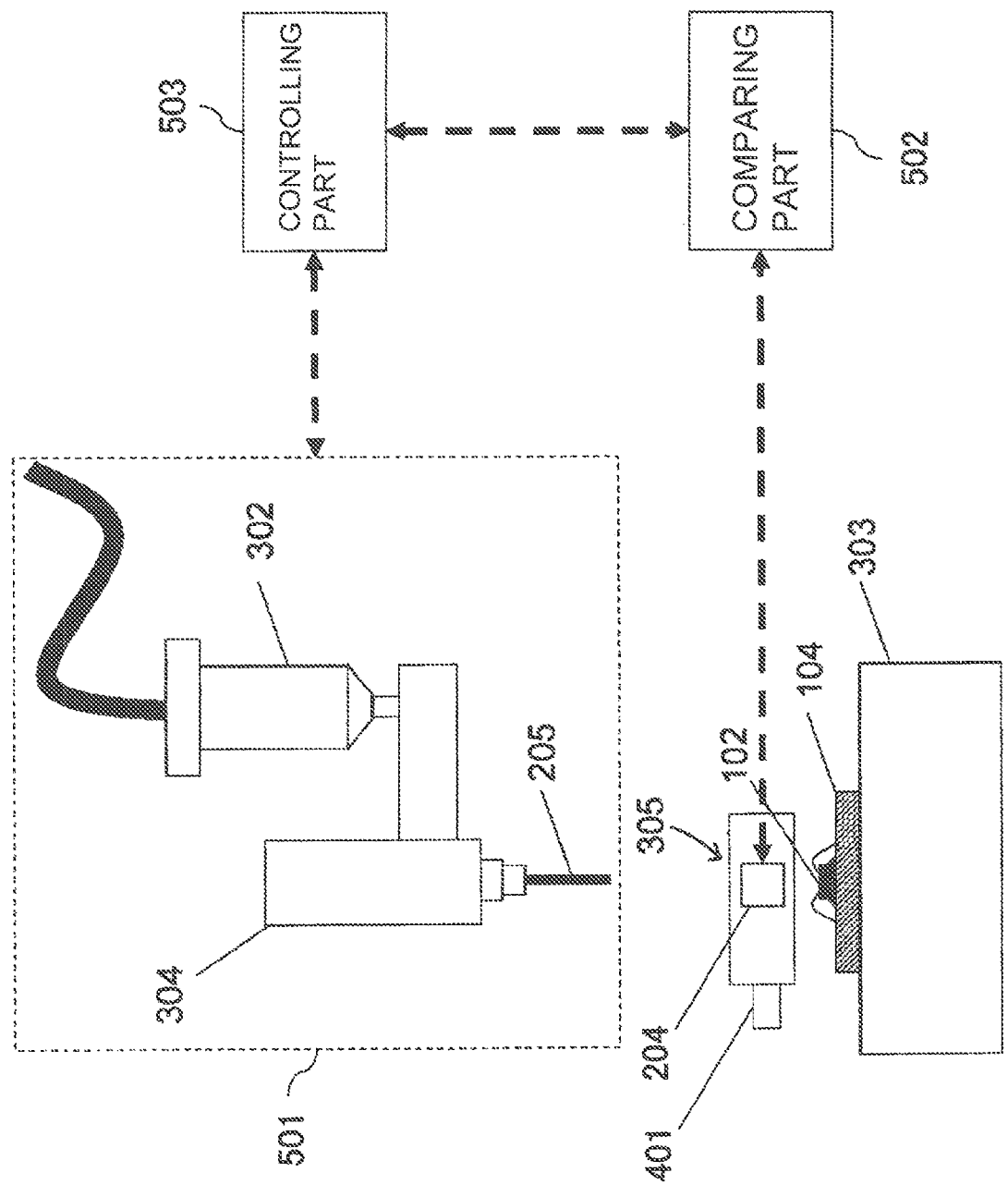
FIG. 8 is a schematic front view of the manufacturing apparatus of white-light emitting elements of Embodiment 1 in the present invention.
Figure 9:
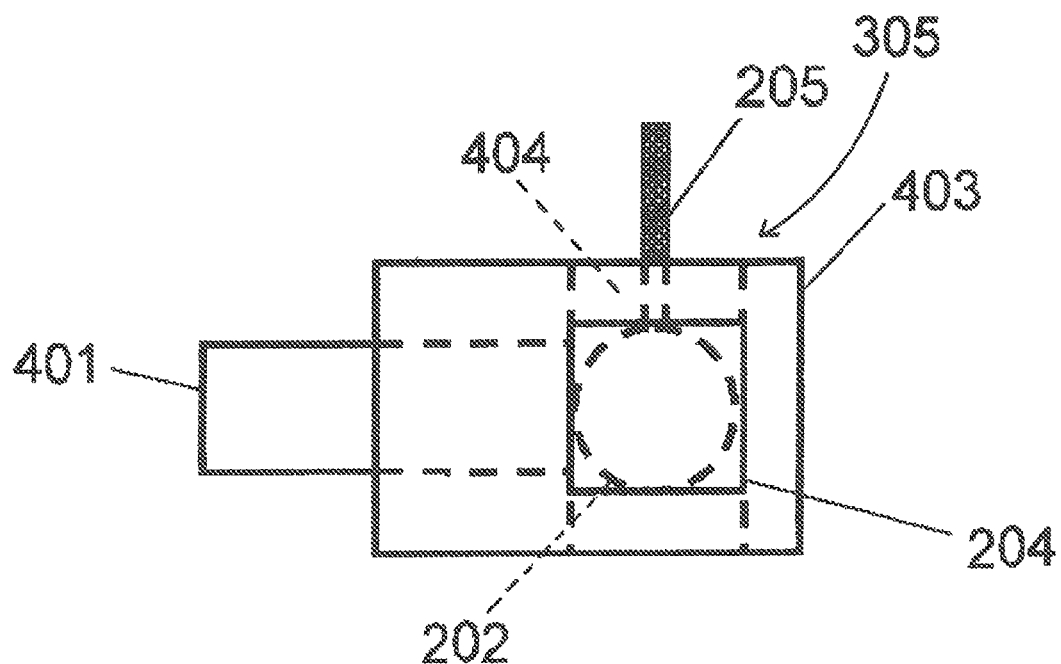
FIG. 9 is a schematic enlarged front view of the metering device of the manufacturing apparatus of white-light emitting elements of Embodiment 1 in the present invention.

Next, mainly referring to FIGS. 8 and 9, descriptions are given regarding the configuration and action of the manufacturing apparatus of white-light emitting elements of the present embodiment.

Additionally, FIG. 8 is a schematic front view of the manufacturing apparatus of white-light emitting elements of Embodiment 1 in the present invention.

Moreover, FIG. 9 is a schematic enlarged front view of the metering device 305 of the manufacturing apparatus of white-light emitting elements of Embodiment 1 in the present invention.

The manufacturing apparatus of white-light emitting elements of the present embodiment is a manufacturing apparatus of a white-light emitting element with the light emitting diode chip 102 covered with the fluorescent-body-containing resin member 101 (see FIG. 1) that has been formed with the fluorescent-body-containing resin material 202 (see FIG. 3(B)) containing a resin and fluorescent bodies, and comprises: the applying part 501; the light source part 401; the measuring part 204; the comparing part 502; and the controlling part 503.

The applying part 501 is a means for applying to the light emitting diode chip 102 the fluorescent-body-containing resin material 202, which has the dispensing needle 205 and is capable of increasing the size of the droplet while maintaining at the tip of the dispensing needle 205 the fluorescent-body-containing resin material 202 in a state of being a droplet.

The light source part 401 is a means for irradiating with the blue laser beam 201 (see FIG. 3(B)) the fluorescent-body-containing resin material 202 that is being maintained at the tip of the dispensing needle 205 in a state of being a droplet.

The measuring part 204 is a means for measuring the fluorescence strength of the fluorescence light emission 203 (see FIG. 3(B)) from the fluorescent bodies that have been excited by the blue laser beam 201 with which the irradiation has been carried out.

The comparing part 502 is a means for performing a comparison between the fluorescence strength that has been measured and the fluorescence strength that is the target.

The controlling part 503 is a means for stopping, based on the result of the comparison, increasing of the size of the droplet at a point in time when the fluorescence strength that has been measured has reached the fluorescence strength that is the target, and controlling the applying part 501 so that the fluorescent-body-containing resin material 202 at the point in time, which is being maintained at the tip of the dispensing needle 205 in a state of being a droplet, is applied.

Additionally, the measuring part 204 is arranged at a position where the fluorescence light emission 203 enters from a direction orthogonal to the direction in which the light source part 401 carries out the irradiation with the blue laser beam 201.

In what follows, more detailed descriptions are given regarding the manufacturing apparatus of white-light emitting elements of the present embodiment.

The stage 303 is a means for conveying the base plate 104.

The applying part 501 comprises the dispensing needle 205, the syringe 302, and the volume-metering-type dispenser 304.

The dispensing needle 205 is a means for applying the fluorescent-body-containing resin material 202 to the light emitting diode chip 102, which has a moving mechanism that enables upward and downward movement.

The syringe 302 is a means for storing the fluorescent-body-containing resin material 202.

The volume-metering-type dispenser 304 is a means for discharging the fluorescent-body-containing resin material 202 with a prescribed discharge quantity.

Additionally, a dispenser of another dispensing system that is not of the volume metering type may be utilized instead of the volume-metering-type dispenser 304.

The metering device 305 comprises, as is shown in FIG. 9, the measuring part 204, the light source part 401, the dark box 403, and the needle-insertion-use hole 404.

The light source part 401, which is a means that utilizes a blue-laser diode as the blue-light source and carries out the irradiation with the blue laser beam 201, is arranged on the side of the left side face of the dark box 403.

The measuring part 204 is arranged on the side of the front face orthogonal to the left side face of the dark box 403.

The needle-insertion-use hole 404 is arranged at a position where the dispensing needle 205 that has moved downward passes, so as to penetrate from the side of the upper face orthogonal to the left side face and front face of the dark box 403 to the side of the lower face.

The measuring part 204 need not be arranged as has been stated above in a direction orthogonal to the optical-axis direction of the blue laser beam 201 with which the light source part 401 carries out the irradiation, but an arrangement on the optical axis of the blue laser beam 201 is not desirable.

Additionally, an optical filter for allowing the blue laser beam 201 not to directly enter the measuring part 204 may be utilized.

Moreover, a simple light-strength-measuring device such as a photodiode and the like may be utilized instead of the measuring part 204.

Since the fluorescence strength of individual white-light emitting elements of the present embodiment that have been manufactured using the manufacturing apparatus of white-light emitting elements of the present embodiment falls within a prescribed range, for the manufacturing apparatus of white-light emitting elements of the present embodiment, by reducing the fluorescence strength variation of individual white-light emitting elements in the forming step of the fluorescent-body-containing resin member it is possible to radically reduce a lowering of the yield accompanying the chromaticity variation of individual white-light emitting elements to improve productivity.

Embodiment 2

Figure 10:
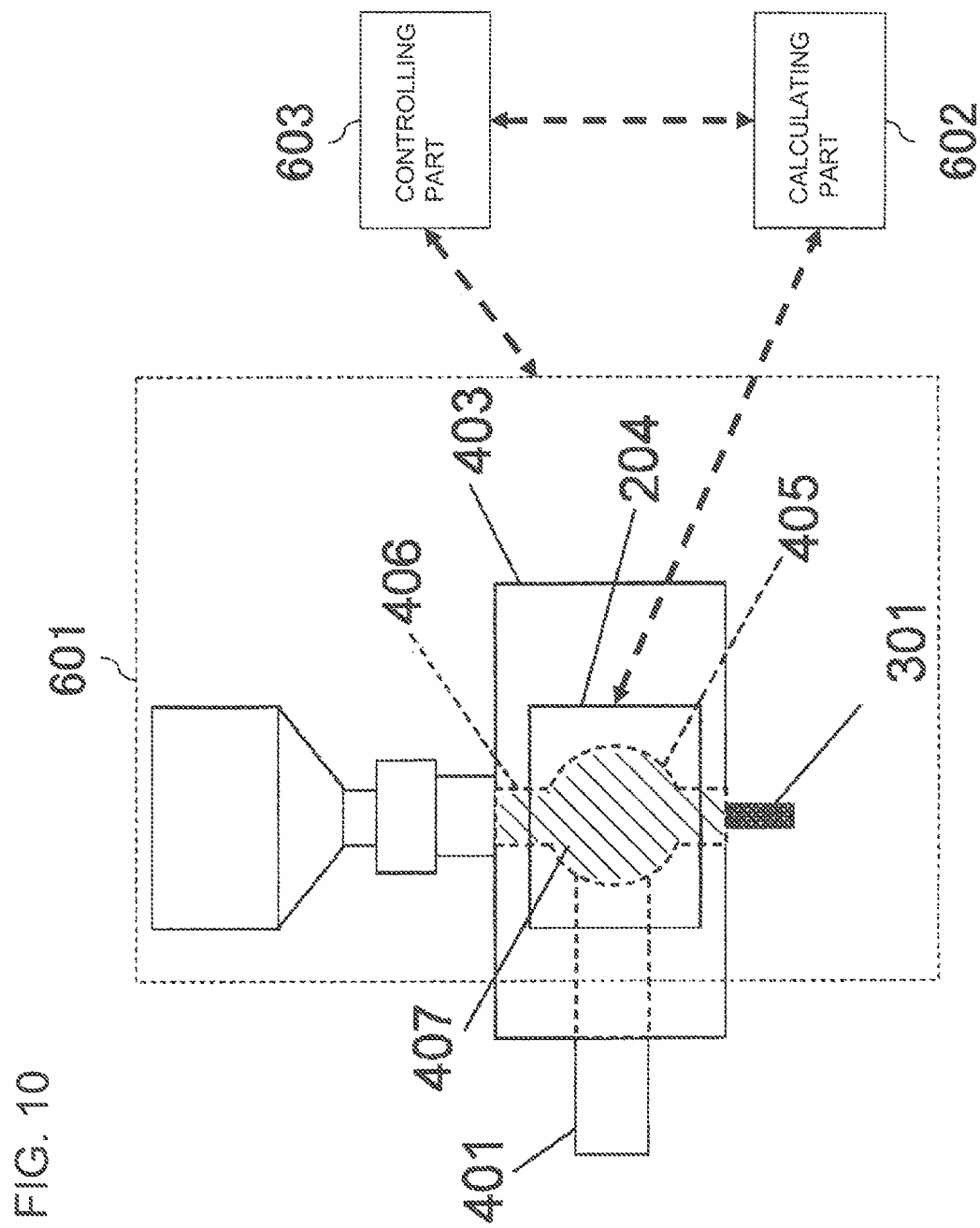
FIG. 10 is a schematic partial enlarged front view of the manufacturing apparatus of white-light emitting elements of Embodiment 2 in the present invention.
Figure 11A:
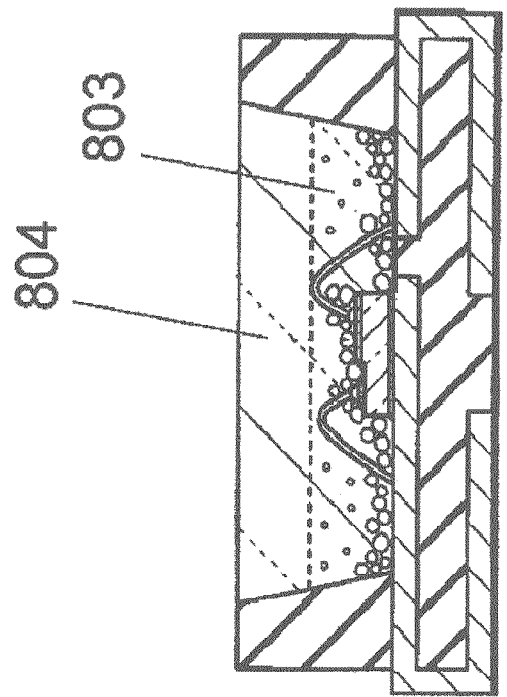
FIG. 11(A) is a schematic perpendicular-section view of the first conventional white-light emitting element.
Figure 11B:
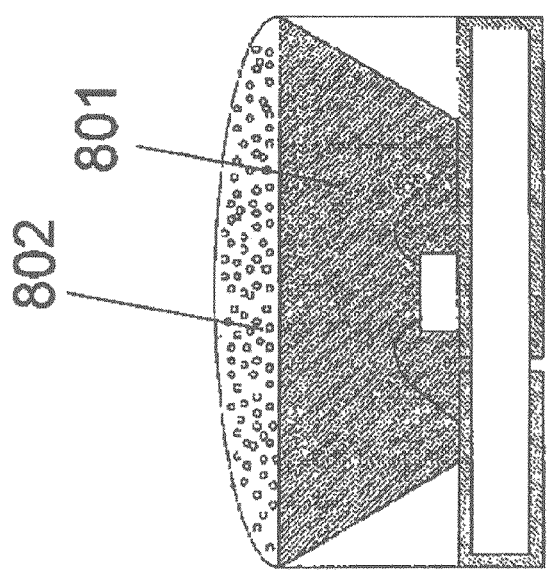
FIG. 11(B) is a schematic perpendicular-section view of the second conventional white-light emitting element.

Next, mainly referring to FIG. 10, descriptions are given regarding the manufacturing method of white-light emitting elements of the present embodiment, and the configuration and action of the manufacturing apparatus of white-light emitting elements of the present embodiment.

Additionally, FIG. 10 is a schematic partial enlarged front view of the manufacturing apparatus of white-light emitting elements of Embodiment 2 in the present invention.

The manufacturing method of white-light emitting elements of the present embodiment is a manufacturing method of a white-light emitting element with the light emitting diode chip 102 (see FIG. 1) covered with the fluorescent-body-containing resin member 101 (see FIG. 1) that has been formed with the fluorescent-body-containing resin material 407 containing a resin and fluorescent bodies, and comprises: an irradiating step of irradiating the fluorescent-body-containing resin material 407 with the blue laser beam 201 (see FIG. 3(B)); a measuring step of measuring the fluorescence strength of the fluorescence light emission 203 (see FIG. 3(B)) from the fluorescent bodies that have been excited by the blue laser beam 201 with which the irradiation has been carried out; and an applying step of applying, to the light emitting diode chip 102, a quantity of the fluorescent-body-containing resin material 407, the quantity being based on the fluorescence strength that has been measured.

Additionally, in the irradiating step, the fluorescent-body-containing resin material 407 is introduced in the liquid reservoir 405, and the fluorescent-body-containing resin material 407 is irradiated with the blue laser beam 201.

Moreover, in the applying step, based on the fluorescence strength that has been measured in the abovenamed measuring step, performed is a calculation relating to the quantity of the fluorescent-body-containing resin material 407 to be applied, and the quantity of the fluorescent-body-containing resin material 407 corresponding to the result of the calculation is applied.

The manufacturing apparatus of white-light emitting elements of the present embodiment is a manufacturing apparatus of a white-light emitting element with the light emitting diode chip 102 (see FIG. 1) covered with the fluorescent-body-containing resin member 101 (see FIG. 1) that has been formed with the fluorescent-body-containing resin material 407 containing a resin and fluorescent bodies, and comprises: the applying part 601; the light source part 401; the measuring part 204; the calculating part 602; and the controlling part 603.

The applying part 601 is a means for applying to the light emitting diode chip 102 the fluorescent-body-containing resin material 407, which has the liquid reservoir 405 and is capable of introducing the fluorescent-body-containing resin material 407 in the liquid reservoir 405.

The light source part 401 is a means for irradiating with the blue laser beam 201 (see FIG. 3(B)) the fluorescent-body-containing resin material 407 that has been introduced in the liquid reservoir 405.

The measuring part 204 is a means for measuring the fluorescence strength of the fluorescence light emission 203 (see FIG. 3(B)) from the fluorescent bodies that have been excited by the blue laser beam 201 with which the irradiation has been carried out.

The calculating part 602 is a means for performing, based on the fluorescence strength that has been measured, a calculation relating to the quantity of the fluorescent-body-containing resin material 407 to be applied.

The controlling part 603 is a means for controlling the applying part 601 so that the quantity of the fluorescent-body-containing resin material 407 corresponding to the result of the calculation is applied.

In what follows, more detailed descriptions are given regarding the manufacturing method of white-light emitting elements of the present embodiment, and the manufacturing apparatus of white-light emitting elements of the present embodiment.

The fluorescent-body-containing resin material 407 is, in case the application of pressure is performed from the syringe 302 (see FIG. 8) side, gradually introduced in the liquid reservoir 405 passing through the fluorescent-body-containing resin material flow passage 406.

And, the fluorescent-body-containing resin material 407 is filled into the portion from the fluorescent-body-containing resin material flow passage 406 to the dispensing needle 301, which includes the liquid reservoir 405.

Additionally, the application of pressure is suspended with timing such that the fluorescent-body-containing resin material 407 does not leak out from the tip of the dispensing needle 301.

Next, the light source part 401 irradiates with the blue laser beam 201 the fluorescent-body-containing resin material 407 which has been filled into the liquid reservoir 405, and the measuring part 204 measures the wavelength and fluorescence strength of the fluorescence light emission 203 from the fluorescent bodies that have been excited.

Here, the light source part 401 is arranged as has been stated above on the side of the left side face of the dark box 403, and the measuring part 204 is arranged on the side of the front face orthogonal to the left side face of the dark box 403.

The calculating part 602 performs a calculation of the quantity of the fluorescent-body-containing resin material 407 to be applied corresponding to the fluorescence strength that has been measured, and the controlling part 603 controls the applying part 601 so that the quantity of the fluorescent-body-containing resin material 407 corresponding to the result of the calculation is applied.

More specifically, the quantity of the unhardened fluorescent-body-containing resin material 407 that is applied, actually, to the light emitting diode chip 102 becomes less than the filling quantity in the liquid reservoir 405 when the fluorescence strength that has been measured is large, and becomes greater than the filling quantity in the liquid reservoir 405 when the fluorescence strength that has been measured is small.

Hence, it is unfavorable that the volumetric capacity of the liquid reservoir 405 is too small by comparison to the average quantity of the fluorescent-body-containing resin material 407 to be applied to the individual light emitting diode chip 102. Namely, since if the volumetric capacity of the liquid reservoir 405 is approximately the same as the said average quantity, the quantity of the fluorescent-body-containing resin material 407 to be applied, for which the calculation has been performed, becomes approximately the same as the filling quantity of the liquid reservoir 405, it is more desirable.

Thus, the dispensing needle 301 is allowed to descend, and the fluorescent-body-containing resin material 407 that has been introduced to the liquid reservoir 405 is applied to the light emitting diode chip 102 and is formed in a prescribed shape.

And, a white-light emitting element is completed through the subsequent step of allowing the fluorescent-body-containing resin material 407 to harden at a constant temperature or more.

Of course, since the fluorescent-body-containing resin material 407 is applied to the light emitting diode chip after being introduced to the liquid reservoir 405, it is not feared that liquid sagging of the fluorescent-body-containing resin material 407 occurs, and the above-stated series of processes is repeatedly implemented.

Like this, in a case where the viscosity of the fluorescent-body-containing resin material 407 for forming the fluorescent-body-containing resin member 101, which is discharged in a liquid state via the dispensing needle 301, is slightly low so that it is difficult to maintain the fluorescent-body-containing resin material 407 in a droplet state over a sufficiently long period of time, the manufacturing method of white-light emitting elements and manufacturing apparatus of white-light emitting elements of the present embodiment particularly demonstrate an excellent effect.

Additionally, since as has been stated above it is not desirable that the measuring part 204 be arranged on the optical axis of the blue laser beam with which the light source part 401 carries out the irradiation, more desirable is an arrangement in a direction that is different from the irradiation direction of the blue laser beam, viewed from the center of the fluorescent-body-containing resin material 407 that has been introduced to the liquid reservoir 405. For example, it is more desirable that the measuring part 204 be arranged in a direction orthogonal to the irradiation direction of the blue laser beam, viewed from the center of the fluorescent-body-containing resin material 407 that has been introduced to the liquid reservoir 405.

INDUSTRIAL APPLICABILITY

A manufacturing method of light emitting elements, and a manufacturing apparatus of light emitting elements in the present invention, with which it is possible to reduce the chromaticity variation of individual light emitting elements while avoiding a lowering of the light-extraction efficiency, are useful for manufacturing light emitting elements that are applied to, for example, illuminating devices of on-vehicle uses and the like, projectors, and liquid crystal back lights.

DESCRIPTION OF THE REFERENCE NUMERALS

101 fluorescent-body-containing resin member
102 light emitting diode chip
103 die bond member
104 base plate
105 gold wire
201 blue laser beam
202 fluorescent-body-containing resin material
203 fluorescence light emission
204 measuring part
205 dispensing needle
301 dispensing needle
302 syringe
303 stage
304 volume-metering-type dispenser
305 metering device
401 light source part
403 dark box
404 needle-insertion-use hole
405 liquid reservoir
406 fluorescent-body-containing resin material flow passage
407 fluorescent-body-containing resin material
501 applying part
502 comparing part
503 controlling part
601 applying part
602 calculating part
603 controlling part
801 first fluorescent-body-containing resin member
802 second fluorescent-body-containing resin member
803 fluorescent-body-containing resin member
804 translucent resin member

The invention claimed is:

1. A manufacturing apparatus of a light emitting element with a light emitting diode covered with a fluorescent-body-containing resin member that has been formed with a fluorescent-body-containing resin material containing a resin and fluorescent bodies, comprising:

an applying part that has a needle, is capable of increasing a size of a droplet while maintaining at a tip of the needle the fluorescent-body-containing resin material in a state of being the droplet, and applies to the light emitting diode the fluorescent-body-containing resin material;

a light source part that irradiates with a laser light the fluorescent-body-containing resin material that is being maintained at the tip of the needle in the state of being the droplet;

a measuring part that has a light-strength-measuring device and measures, with the light-strength-measuring device, a fluorescence strength of a fluorescence light emission from the fluorescent bodies of the fluorescent-body-containing resin material that is being maintained at the tip of the needle in the state of being the droplet that have been excited by the laser light with which irradiation has been carried out;

a comparing part that performs a comparison between the fluorescence strength that has been measured and a fluorescence strength that is a target; and a controlling part that controls the applying part so that (i) the size of the droplet being maintained at the tip of the needle is increased while a result of the comparison by the comparing part shows that the fluorescence strength that has been measured has not reached the fluorescence strength that is the target, (ii) increasing of the size of the droplet is stopped at a point in time when the result of the comparison has shown that the fluorescence strength that has been measured has reached the fluorescence strength that is the target, and (iii) the fluorescent-body-containing resin material at the point in time, which is being maintained at the tip of the needle in the state of being the droplet, is applied.

2. The manufacturing apparatus of the light emitting element according to claim 1, wherein the measuring part is arranged at a position where the fluorescence light emission enters from a direction orthogonal to a direction in which the light source part carries out the irradiation with the light.

3. The manufacturing apparatus of the light emitting element according to claim 1, wherein a metering device is utilized that includes a dark box, and in the dark box, the fluorescent-body-containing resin material is irradiated with the laser light, so that the fluorescence strength of the fluorescence light emission from the fluorescent bodies that have been excited by the laser light is measured in the dark box with the light-strength-measuring device.

4. The manufacturing apparatus of the light emitting element according to claim 1, wherein a metering device is utilized that includes a penetrating hole in a direction from an upper face to a lower face, through which the fluorescent-body-containing resin material to be applied passes, and in a horizontal direction of the metering device, the light source part and the measuring part are positioned.

* * * * *